United States Patent
Johnson et al.

(10) Patent No.: US 9,608,144 B2
(45) Date of Patent: Mar. 28, 2017

(54) PHOTOVOLTAIC DEVICES AND METHOD OF MAKING

(75) Inventors: James Neil Johnson, Scotia, NY (US); Bastiaan Arie Korevaar, Schenectady, NY (US); Timothy John Sommerer, Ballston Spa, NY (US)

(73) Assignee: First Solar, Inc., Tempe, AZ (US)

( * ) Notice: Subject to any disclaimer, the term of this patent is extended or adjusted under 35 U.S.C. 154(b) by 151 days.

(21) Appl. No.: 13/150,485

(22) Filed: Jun. 1, 2011

(65) Prior Publication Data

US 2012/0305064 A1    Dec. 6, 2012

(51) Int. Cl.
| | |
|---|---|
| H01L 31/0256 | (2006.01) |
| H01L 31/0296 | (2006.01) |
| H01L 31/0272 | (2006.01) |
| H01L 31/073 | (2012.01) |
| H01L 31/0352 | (2006.01) |

(52) U.S. Cl.
CPC .... *H01L 31/02963* (2013.01); *H01L 31/0272* (2013.01); *H01L 31/0296* (2013.01); *H01L 31/02725* (2013.01); *H01L 31/0352* (2013.01); *H01L 31/073* (2013.01); *Y02E 10/543* (2013.01)

(58) Field of Classification Search
CPC ............ H01L 31/0296–31/02963; H01L 31/0272–31/02725; H01L 31/073; H01L 31/0352; Y02E 10/543
USPC ................................. 136/243–265
See application file for complete search history.

(56) References Cited

U.S. PATENT DOCUMENTS

| | | | |
|---|---|---|---|
| 4,035,197 A | 7/1977 | Raychaudhuri | |
| 4,207,119 A | 6/1980 | Tyan | |
| 4,335,266 A * | 6/1982 | Mickelsen et al. | 136/260 |
| 4,379,943 A | 4/1983 | Yang et al. | |
| 4,388,483 A * | 6/1983 | Basol et al. | 136/260 |
| 4,710,589 A | 12/1987 | Meyers et al. | |
| 5,304,499 A | 4/1994 | Bonnet et al. | |

(Continued)

FOREIGN PATENT DOCUMENTS

| | | |
|---|---|---|
| CN | 101779290 A | 7/2010 |
| WO | 2007129097 A2 | 11/2007 |

OTHER PUBLICATIONS

Simin. "Doped Semiconductors: donor impurities." Published 2008 on http://www.ee.sc.edu/people/faculty/?id=simin, PDF link: http://www.ee.sc.edu/personal/faculty/simin/ELCT566/03%20Semiconductors%20II-Doped,%20transport.pdf.*

(Continued)

*Primary Examiner* — James Lin
*Assistant Examiner* — Liesl C Baumann
(74) *Attorney, Agent, or Firm* — MacMillan, Sobanski & Todd, LLC

(57) ABSTRACT

In one aspect of the present invention, a photovoltaic device is provided. The photovoltaic device includes a window layer and an absorber layer disposed on the window layer, wherein the absorber layer includes a first region and a second region, the first region disposed adjacent to the window layer. The absorber layer further includes a first additive and a second additive, wherein a concentration of the first additive in the first region is greater than a concentration of the first additive in the second region, and wherein a concentration of the second additive in the second region is greater than a concentration of the second additive in the first region. Method of making a photovoltaic device is also provided.

19 Claims, 3 Drawing Sheets

(56) References Cited

U.S. PATENT DOCUMENTS

| | | | |
|---|---|---|---|
| 5,501,744 A * | 3/1996 | Albright et al. | 136/258 |
| 2007/0023081 A1* | 2/2007 | Johnson et al. | 136/258 |
| 2008/0169019 A1* | 7/2008 | Korevaar et al. | 136/251 |
| 2009/0078318 A1* | 3/2009 | Meyers et al. | 136/260 |
| 2009/0194166 A1* | 8/2009 | Powell et al. | 136/260 |
| 2010/0012188 A1* | 1/2010 | Garnett | 136/260 |
| 2010/0059112 A1* | 3/2010 | Gupta et al. | 136/256 |
| 2010/0126580 A1* | 5/2010 | Farrell et al. | 136/256 |
| 2010/0276785 A1* | 11/2010 | Kamath et al. | 257/614 |
| 2010/0282320 A1 | 11/2010 | Meyers et al. | |
| 2010/0288359 A1 | 11/2010 | Xiong et al. | |

OTHER PUBLICATIONS

Leonid Kosyachenko (2010). Efficiency of Thin-Film CdS/CdTe Solar Cells, Solar Energy, Radu D Rugescu (Ed.), ISBN: 978-953-307-052-0, InTech, Available from: http://www.intechopen.com/books/solarenergy/ efficiency-of-thin-film-cds-cdte-solar-cells.*

Wang et al. "II-IV Semiconductors for Optoelectronics: CdS, CdSe, CdTe." In Springer Handbook of Electronic and Photonic Materials; Kasap, S.; Capper, P., Eds; Springer: New York 2006, pp. 829-842.*

Emziane et al. "Effect of CdCl2 activation on the impurity distribution in CdTe/CdS solar cell structures." Thin Solid Films 480-481, 377-381, available online Dec. 8, 2004.*

D. P. Halliday, M. Emziane, K. Durose, A. Bosio and N. Romeo, "Effects of Impurities in CdTe/CdS Structures: Towards Enhanced Device Efficiencies," 2006 IEEE 4th World Conference on Photovoltaic Energy Conference, Waikoloa, HI, 2006, pp. 408-411.*

Emziane, et al. "SIMS depth profiling of CdTe-based solar cells grown on sapphire substrates," Thin Solid Films 511-512 (2006) 66-70.*

Albin et al., "The Effect of Oxygen on Interface Microstructure Evolution in CdS/CdTe Solar Cells", Progress in Photovoltaics, vol. 10, Issue 5, Aug. 2002, pp. 309-322.

Rose et al., "Fabrication Procedures and Process Sensitivities for CdS/CdTe Solar Cells", Progress in Photovoltaics, vol. 7, Issue 5, Sep./Oct. 1999, pp. 331-340.

Zhao et al., "Process Development for High VOC CdTe Solar Cells", DOE Solar Energy Technologies Program Peer Review,Denver, Colorado, Apr. 17-19, 2007, 26 pages.

Bonnet, "Manufacturing of CSS CdTe solar cells", Thin Solid Films, 2000, vol. 361-362, pp. 547-552.

Bosio et al., "Polycrystalline CdTe thin films for photovoltaic applications", Progress in Crystal Growth and Characterization of Materials, 2006, vol. 52, pp. 247-279.

"Cadmium Telluride Photovoltaics", Wikipedia, the free encyclopedia, Web Article accessed May 18, 2015, pp. 1-11.

Morales-Acevedo, "Thin film CdS/CdTe solar cells: Research perspectives", Solar Energy, 2006, vol. 80, pp. 675-681.

Yan et al., "Transmission electron microscopy study of dislocations and interfaces in CdTe solar cells", Thin Solid Films, 2011, vol. 519, pp. 7168-7172.

European Extended Search Report, Application No. 12170302.9 dated Jan. 27, 2015.

Amin et al., "Effect of ZnTe and CdZnTe Alloys at the Back Contact of 1-μm-Thick CdTe Thin Film Solar Cells", Japan Journal of Applied Physics, 2002, vol. 41, pp. 2834-2841.

European Communication pursuant to Article 94(3) EPC, Application No. EP 12170302.9, dated Sep. 17, 2015.

Chinese Patent Application 201210325699.X, Office Action dated Oct. 8, 2015.

Emziane et al. "Efficiency improvement in thin-film solar cell devices with oxygen-containing absorber layer," Applied Physics Letters, vol. 87, 261901, Dec. 2005.

Chinese Second Office Action, Application No. CN 201210325699. X, dated Jun. 13, 2016.

European Summons, Application No. EP 12170302.9, dated Jul. 21, 2016.

* cited by examiner

PHOTOVOLTAIC DEVICES AND METHOD OF MAKING

BACKGROUND

The invention generally relates to photovoltaic devices. More particularly, the invention relates to photovoltaic devices that include an absorber layer.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells.

Cadmium telluride (CdTe)-based photovoltaic devices typically demonstrate relatively low power conversion efficiencies, which may be attributed to a relatively low open circuit voltage ($V_{oc}$) in relation to the band gap of the material which is due, in part, to the low effective carrier concentration and short minority carrier lifetime in CdTe. Effective carrier concentration of CdTe may be improved by doping with p-type dopants. However, carrier lifetime and carrier concentration are typically coupled in photovoltaic devices, which means that increase in carrier density may lead to a decrease in carrier lifetime, especially at the front interface between CdS and CdTe. It may be desirable to decouple this interaction.

Thus, improving the interface between CdS and CdTe resulting in high minority carrier lifetimes at the front interface may be desirable. Further, there is a need to provide improved photovoltaic device configurations having doped-CdTe layers and higher carrier densities at the back interface resulting in higher efficiencies.

BRIEF DESCRIPTION OF THE INVENTION

Embodiments of the present invention are provided to meet these and other needs. One embodiment is a photovoltaic device. The photovoltaic device includes a window layer and an absorber layer disposed on the window layer, wherein the absorber layer includes a first region and a second region, the first region disposed adjacent to the window layer. The absorber layer further includes a first additive and a second additive, wherein a concentration of the first additive in the first region is greater than a concentration of the first additive in the second region, and wherein a concentration of the second additive in the second region is greater than a concentration of the second additive in the first region.

One embodiment is a photovoltaic device. The photovoltaic device includes a window layer and an absorber layer disposed on the window layer, wherein the absorber layer includes a first region and a second region, the first region disposed adjacent to the window layer. The absorber layer further includes a first additive and a second additive, the first additive including oxygen and the second additive including nitrogen, arsenic, phosphorous, antimony, zinc, or combinations thereof. A concentration of the first additive continuously decreases from the first region to the second region, and a concentration of the second additive continuously increases from the first region to the second region.

One embodiment is a photovoltaic device. The photovoltaic device includes a window layer and an absorber layer disposed on the window layer, wherein the absorber layer includes a first region and a second region, the first region disposed adjacent to the window layer. The absorber layer further includes a first additive and a second additive, the first additive including oxygen and the second additive including nitrogen, arsenic, phosphorous, antimony, zinc, or combinations thereof. Further, the first region includes the first additive and is substantially free of the second additive, and the second region includes the second additive and is substantially free of the first additive.

One embodiment is a method. The method includes disposing an absorber layer on a window layer, wherein the absorber layer includes a first region and a second region. Disposing the absorber layer includes disposing the first region on the window layer in a first environment including a precursor for a first additive, and disposing the second region on the first region in a second environment including a precursor for a second additive.

DRAWINGS

These and other features, aspects, and advantages of the present invention will become better understood when the following detailed description is read with reference to the accompanying drawings, wherein.

DETAILED DESCRIPTION

As discussed in detail below, some of the embodiments of the invention include photovoltaic devices including an absorber layer. Further, some of the embodiments of the invention include photovoltaic devices including an absorber layer having a first region that includes a first additive (for example, oxygen) and a second region that includes a second additive (for example, nitrogen or zinc). Further, in certain embodiments of the invention, the second additive is compositionally graded across the second region. A gradient in concentration of the second additive in the second region generates a field within the absorber layer (for example, CdTe), which may help with the collection of charge carriers. Further, oxygen at the interface between the window and absorber layers (for example, CdS/CdTe) provides improved interface properties, allowing for high minority carrier lifetimes at the interface in contact with the window layer.

In one embodiment, a photovoltaic device including an absorber layer having a graded composition profile for the two additives is provided. In an alternate embodiment, a photovoltaic device including an absorber layer having two distinct compositional regimes is provided.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

The terms "transparent region" and "transparent layer" as used herein, refer to a region or a layer that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated.

Figure 1:
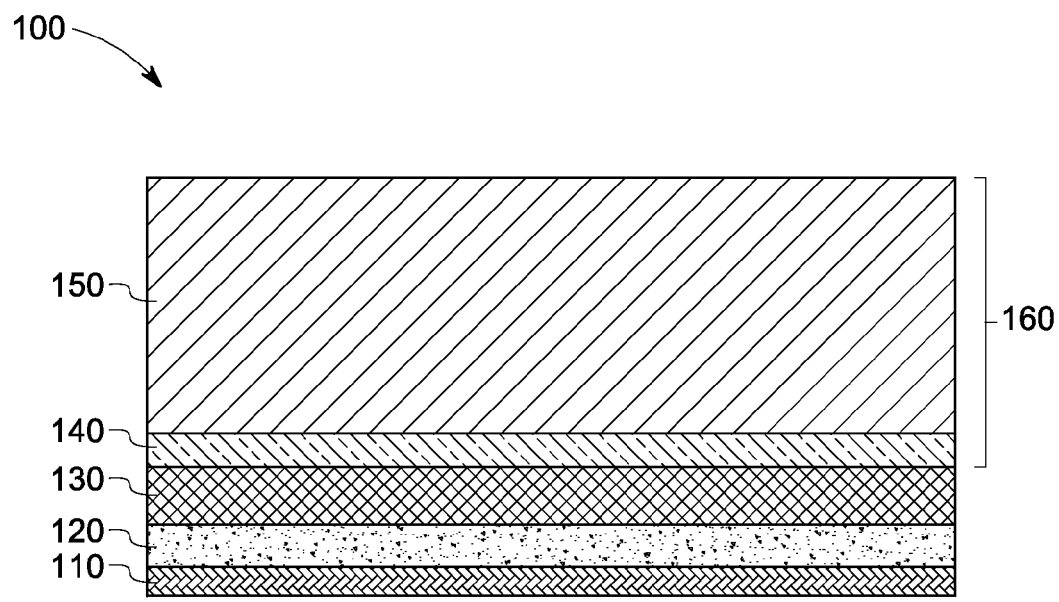
FIG. 1 is a schematic of a photovoltaic device, according to one embodiment of the invention.
Figure 2:
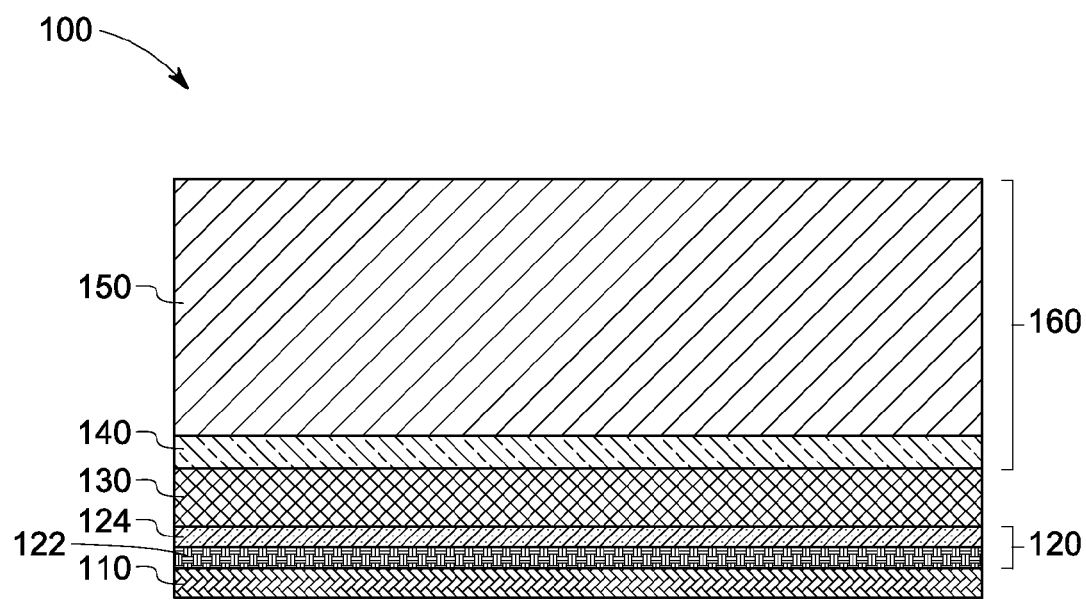
FIG. 2 is a schematic of a photovoltaic device, according to one embodiment of the invention.
Figure 3:
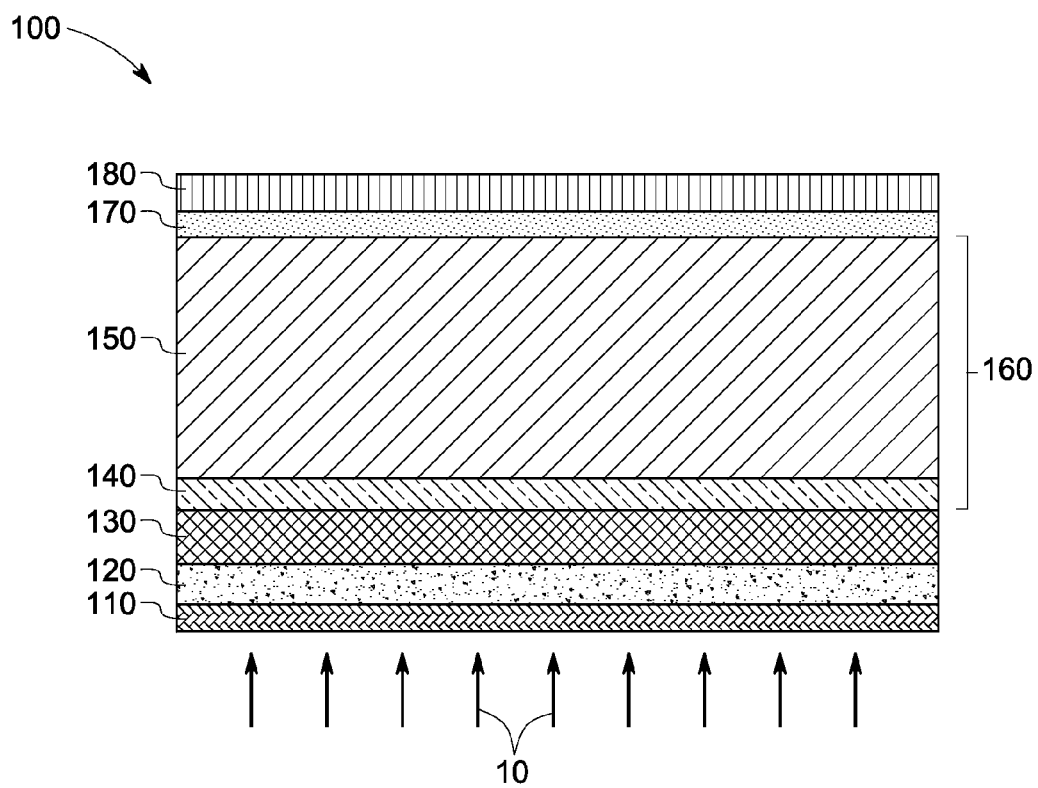
FIG. 3 is a schematic of a photovoltaic device, according to one embodiment of the invention.

As discussed in detail below, some embodiments of the invention are directed to a photovoltaic device including an absorber layer. A photovoltaic device 100, according to one embodiment of the invention, is illustrated in FIGS. 1-3. As shown in FIGS. 1-3, the photovoltaic device 100 includes a window layer 130 and an absorber layer 160 disposed on the window layer 130. In one embodiment, the absorber layer 160 includes a first region 140 and a second region 150, wherein the first region 140 is disposed adjacent to a window layer 130, as shown in FIGS. 1-3. The term "adjacent" as used herein means that the first region 140 is in direct contact with the window layer 130.

In one embodiment, the absorber layer 160 includes a first additive and a second additive. In certain embodiments, a concentration of the first additive in the first region 140 is greater than a concentration of the first additive in the second region 150. Further, in certain embodiments, a concentration of the second additive in the second region 150 is greater than a concentration of the second additive in the first region 140. In some embodiments, the first region 140 in the absorber layer 160 is optimized for carrier lifetime and the second region 150 in the absorber layer 160 is optimized for carrier density.

The term "window layer" as used herein refers to a semiconducting layer that is substantially transparent and forms a heterojunction with the absorber layer. In some embodiments, the window layer 130 includes an n-type semiconductor material. In such embodiments, the absorber layer 160 may be doped to be p-type and the window layer 130 and the absorber layer 160 may form an "n-p" heterojunction. Non-limiting exemplary materials for the window layer 130 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO,H), or combinations thereof. In a particular embodiment, the window layer 130 includes CdS.

The term "absorber layer" as used herein refers to a semiconducting layer wherein the solar radiation is absorbed. Typically, when solar radiation 10 is incident on the photovoltaic device 100, electrons in the absorber layer 160 are excited from a lower energy "ground state," in which they are bound to specific atoms in the solid, to a higher "excited state," in which they can move through the solid.

In one embodiment, the absorber layer 160 includes a p-type semiconductor material. In one embodiment, the absorber layer 160 has an effective carrier density in a range from about $1\times10^{13}$ per cubic centimeter to about $1\times10^{16}$ per cubic centimeter. As used herein, the term "effective carrier density" refers to the average concentration of holes and electrons in a material. In such instances, the window layer 130 may be doped to be n-type, and the absorber layer 160 and the window layer 130 may form a "p-n" or "n-p" junction, as mentioned above.

In one embodiment, a photoactive material is used for forming the absorber layer 160. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium sulphide (CIS), copper indium gallium selenide (CIGS), copper zinc tin sulphide (CZTS), or combinations thereof. The above-mentioned photo-active semiconductor materials may be used alone or in combination. Further, these materials may be present in more than one layer, each layer having different type of photo-active material or having combinations of the materials in separate layers. In one particular embodiment, the absorber layer 160 includes cadmium telluride (CdTe). In one particular embodiment, the absorber layer 160 includes p-type cadmium telluride (CdTe).

In some embodiments, the window layer 130 and the absorber layer 160 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

As noted earlier, the absorber layer 160 includes a first region 140 and a second region 150. In some embodiments, the first region 140 may function as an interfacial region between the window layer 130 and the second region 150. The composition of the first region 140 may provide for desirable interface properties between the window layer 130 and the absorber layer 160. Further, in some embodiments, the second region 150 of the absorber layer 160 may function as a bulk region of the absorber layer 160. As described herein, the terms "first region" and "interfacial region" are used interchangeably. Further, the terms "bulk region" and "second region" are used herein interchangeably.

Accordingly, in some embodiments, the first region 140 has a thickness less than a thickness of the second region 150. In some embodiments, the first region 140 has a thickness in a range from about 10 nanometers to about 500 nanometers. In some embodiments, the first region 140 has a thickness in a range from about 20 nanometers to about 200 nanometers. In particular embodiments, the first region 140 has a thickness in a range from about 50 nanometers to about 100 nanometers.

In some embodiments, the second region 150 has a thickness in a range from about 500 nanometers to about 5000 nanometers. In some embodiments, the second region 150 has a thickness in a range from about 750 nanometers to about 4000 nanometers. In particular embodiments, the second region 150 has a thickness in a range from about 1000 nanometers to about 3000 nanometers.

As noted earlier, an improved interface between the window and absorber layers, for example, an interface between CdS/CdTe layers, may be desirable. Further, doping of the absorber layer with p-type dopant that does not adversely affect the interface between the absorber and window layer may be desirable. Accordingly, in some embodiments, an absorber layer 160 having two additives, that is, a first additive and a second additive, is provided.

In one embodiment, the first additive includes a material that provides for an improved interface between the window layer 130 and the absorber layer 160. In one embodiment, the first additive includes a material that provides for an improved interface between CdS and CdTe. In a particular embodiment, the first additive includes oxygen. In a particular embodiment, the first additive is solely oxygen (aside from incidental impurities).

In one embodiment, the second additive includes a p-type dopant for the absorber layer 160. In one embodiment, the second additive includes a p-type dopant for CdTe. In one embodiment, the second additive includes nitrogen, arsenic, phosphorous, zinc, antimony, or combinations thereof. In one embodiment, the second additive includes nitrogen. In a particular embodiment, the second additive is solely nitrogen (aside from incidental impurities).

In one embodiment, the second additive includes zinc. In one embodiment, the second additive is solely zinc (aside from incidental impurities). Without being bound by any theory, it is believed that zinc may decrease the deep defect states in the absorber layer 160. Further, in some embodiments, zinc may increase the carrier density in the absorber layer material, as well as provide an increase in bandgap, creating a graded bandgap absorber material.

In some embodiments, the second additive includes a combination of additive materials. In some embodiments, the second additive includes a combination of a p-type dopant and zinc. In particular embodiments, the second additive includes a combination of nitrogen and zinc.

Further, in one embodiment, an absorber layer 160 having two different concentration profiles for the two additives is provided. Referring to FIGS. 1-4, in certain embodiments, a concentration of the first additive in the first region 140 is greater than a concentration of the first additive in the second region 150. Further, in certain embodiments, a concentration of the second additive in the second region 150 is greater than a concentration of the second additive in the first region 140. The term "concentration" as used herein refers to the atomic concentration or the number of atoms per unit volume of the first additive or the second additive present in the absorber layer. Further, it should be noted that the term "concentration" refers to an average number of atoms per unit volume in the first region or the second region. As noted earlier, in some embodiments, the second additive includes a combination of additive materials. In such embodiments, the term "concentration of the second additive" refers to the average concentration of the combination of additive materials, for example, average concentration of nitrogen and zinc.

In some embodiments, the first region 140 disposed adjacent to the window layer 130 includes a first additive, wherein the first region 140 is substantially free of the second additive. The term "substantially free of second additive" as used herein means that a concentration of the second additive in the first region 140 is less than about $10^{17}$ cm$^{-3}$. In one embodiment, a concentration of the second additive in the first region 140 is less than about $10^{16}$ cm$^{-3}$. In one embodiment, a concentration of second additive in the first region 140 is less than about $10^{15}$ cm$^{-3}$. In certain embodiments, the first region 140 disposed adjacent to the window layer 130 includes oxygen as the first additive and is substantially free of the second additive, for example, nitrogen.

Similarly, in some other embodiments, the second region 150 includes a second additive, wherein the second region 150 is substantially free of the first additive. The term "substantially free of first additive" as used herein means that a concentration of the first additive in the second region 150 is less than about $10^{17}$ cm$^{-3}$. In one embodiment, a concentration of the first additive in the second region 150 is less than about $10^{16}$ cm$^{-3}$. In one embodiment, a concentration of the first additive in the second region is less than about $10^{15}$ cm$^{-3}$. In certain embodiments, the second region 150 is substantially free of oxygen. In certain embodiments, the second region 150 includes nitrogen as the second additive and is substantially free of oxygen. In certain embodiments, the second region 150 includes zinc as the second additive and is substantially free of oxygen. In certain embodiments, the second region 150 includes a combination of nitrogen and zinc as the second additive and is substantially free of oxygen.

Figure 5:
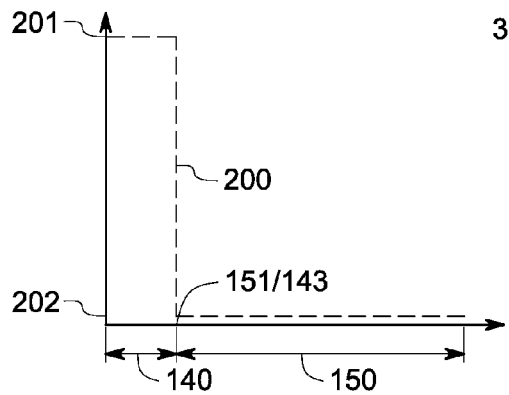
FIG. 5 is an illustration of concentration profile of first additive in the absorber layer, according to an exemplary embodiment of the invention.
Figure 6:
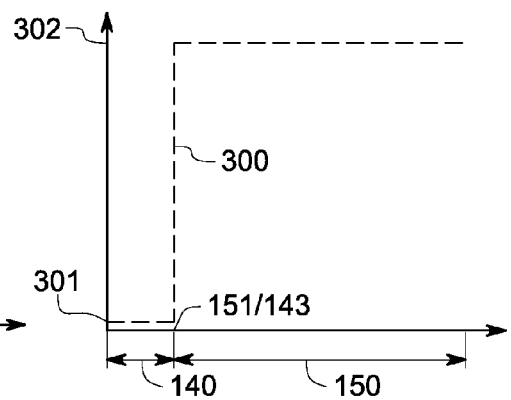
FIG. 6 is an illustration of concentration profile of second additive in the absorber layer, according to an exemplary embodiment of the invention.

In some embodiments, the first region 140 includes the first additive and is substantially free of the second additive. Further, the second region 150 includes the second additive and is substantially free of the first additive. In such embodiments, there may be a step change in the concentration profile of the first additive and the second additive at the transition between the first region 140 and the second region 150, as illustrated in FIGS. 5 and 6. An absorber layer 160, in such embodiments may include two distinct compositional regimes and may be configured as a bilayer.

Figure 4:
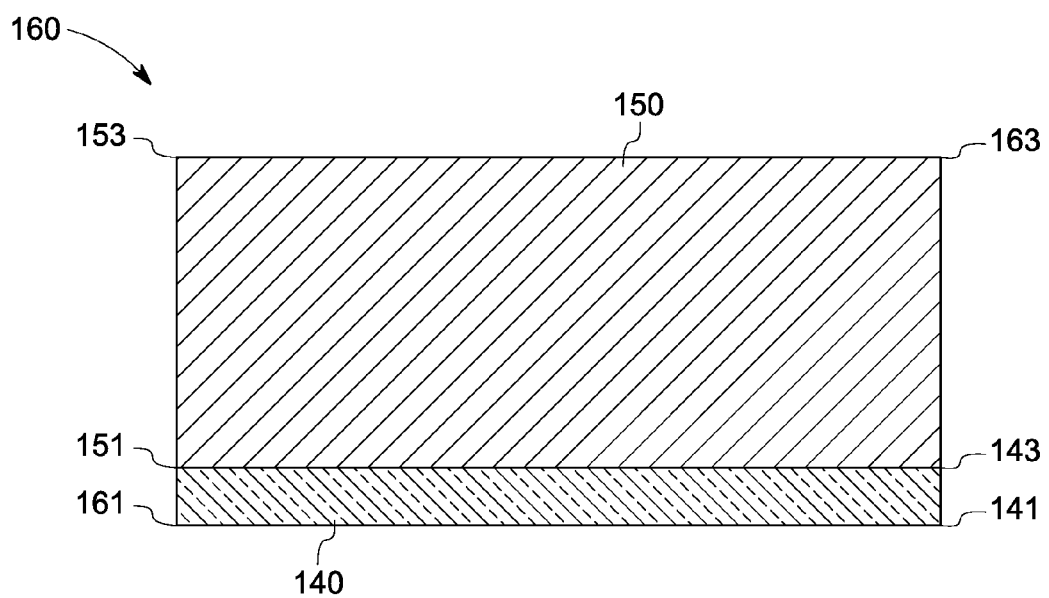
FIG. 4 is a schematic of a photovoltaic device, according to one embodiment of the invention.

Referring to FIGS. 4 and 5, a concentration profile 200 of the first additive in the absorber layer 160 is shown, according to one embodiment of the invention. As indicated, in FIG. 5, the concentration of the first additive has a value 201 in the first region 140, which decreases to a value 202 in the second region 150. The step change from 201 to 202 occurs at the interface 151/143 between the first region 140 and the second region 150, in one embodiment. As noted earlier, in certain embodiments, the second region 150 is substantially free of the first additive.

Similarly, referring to FIGS. 4 and 6, a concentration profile 300 of the second additive in the absorber layer 160 is shown, according to one embodiment of the invention. As indicated, in FIG. 6, the concentration of the second additive has a value 301 in the first region 140, which increases to a value 302 in the second region 150. The step change from 301 to 302 occurs at the interface 151/143 between the first region 140 and the second region 150, in one embodiment. As noted earlier, in certain embodiments, the first region 140 is substantially free of the second additive.

It should be further noted that in FIGS. 5 and 6, the concentration profile of the first additive and the second additive has been illustrated as having a constant value in the first region 140 and the second region 150 as an exemplary embodiment only. In some embodiments, the concentration profile of the first additive in the first region 140 may vary across the thickness of the first region 140. For example, in one embodiment, the concentration of the first additive may decrease from the interface 141 in contact with the window layer 130 to the interface 143 in contact with the second region 150. In such embodiments, the value 201 may represent the average concentration of the first additive. In an alternate embodiment, the concentration of the first additive in the first region may be substantially constant across the thickness of the first region 140, as indicated in FIG. 5.

Similarly, in one embodiment, the concentration profile of the second additive in the second region 150 may vary across the thickness of the second region 150. For example, in one embodiment, the concentration of the second additive may increase from the interface 151 in contact with the first region 140 to the interface 153 in contact with the back contact layer 180 or the p+-type semiconductor layer 170. In such embodiments, the value 302 may represent the average concentration of the second additive. In an alternate embodiment, the concentration of the second additive in the second region 150 may be substantially constant across the thickness of the second region 150, as indicated in FIG. 6.

In particular embodiments, the concentration of the first additive, for example, oxygen is substantially constant across the thickness of the first region 140 and further the concentration of the second additive, for example, nitrogen is graded across the thickness of the second region 150. In one embodiment, the concentration of the second additive, for example, nitrogen increases from the interface 151 in contact with the first region 140 to the interface 153 in contact with the back contact layer 180 or the p+-type semiconductor layer 170. The term "substantially constant" as used herein means that a change in concentration is less than 5 percent across the thickness of the first region or the second region.

Without being bound by any theory, it is believed that a gradient in concentration of the second additive in the second region 150 may generate a field within the absorber layer (for example, CdTe), which may help with the collection of charge carriers. Further, oxygen at the interface between the window and absorber layers (for example, CdS/CdTe) may improve the interface properties, allowing for high minority carrier lifetimes at the front interface of the absorber layer or the interface in contact with the window layer.

Figure 7:
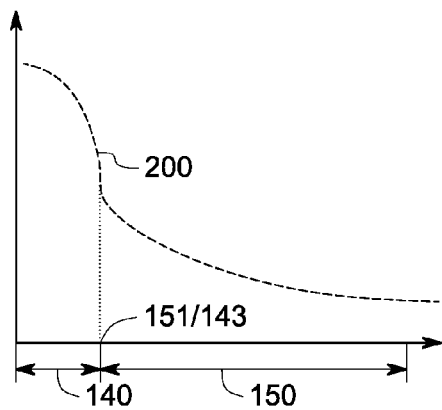
FIG. 7 is an illustration of concentration profile of first additive in the absorber layer, according to an exemplary embodiment of the invention.
Figure 8:
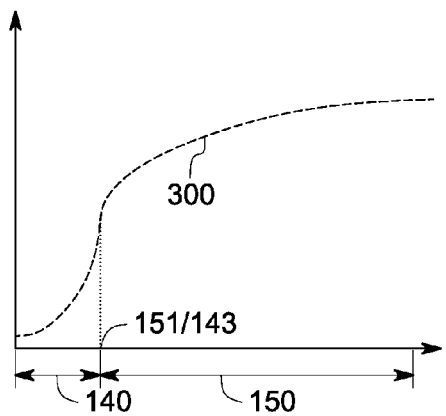
FIG. 8 is an illustration of concentration profile of second additive in the absorber layer, according to an exemplary embodiment of the invention.

In an alternate embodiment, an absorber layer 160 having a graded composition profile for the two additives is provided. With reference to FIG. 7, in one embodiment, the first additive is compositionally graded across a thickness of the absorber layer 160. Further, with reference to FIG. 8, in one embodiment, the second additive is compositionally graded across a thickness of the absorber layer 160. The term "compositionally graded" as used herein means that a concentration of the first additive or the second additive continuously changes across a thickness of the absorber layer 160. In one embodiment, a concentration of the first additive continuously decreases from the surface 141/161 in contact with the window layer 150 to the surface 153/163 in contact with the metal layer 190 or the p+-type semiconductor layer 170, as indicated in FIGS. 4 and 7. In one embodiment, a concentration of the second additive continuously increases from the surface 141/161 in contact with the window layer 150 to the surface 153/163 in contact with the back-contact layer 180 or the p+-type semiconductor layer 170, as indicated in FIGS. 4 and 8. It should be noted that the concentration profiles 200 and 300 of the first and second additives are exemplary profiles and the concentration profiles may vary.

In particular embodiments, the concentration of the first additive, for example, oxygen, continuously decreases from the surface 141/161 in contact with the window layer 150 to the surface 153/163 in contact with the back-contact layer 180 or the p+-type semiconductor layer 170, as indicated in FIG. 7. Further, in one particular embodiment, the concentration of the second additive, for example, nitrogen continuously increases from the surface 141/161 in contact with the window layer 150 to the surface 153/163 in contact with the back-contact layer 180 or the p+-type semiconductor layer 170, as indicated in FIG. 8.

In some embodiments, the concentration of the first additive, for example, oxygen is substantially constant across the thickness of the first region 140 and further the concentration of the first additive is graded across the thickness of the second region 150. In some embodiments, the concentration of the first additive decreases from the interface 151 in contact with the first region 140 to the interface 153 in contact with the back contact layer 180 or the p+-type semiconductor layer 170.

In some embodiments, the concentration of the second additive, for example, nitrogen is substantially constant across the thickness of the second region 150 and further the concentration of the second additive is graded across the thickness of the first region 140. In one embodiment, the concentration of the second additive decreases from the interface 151 in contact with the first region 140 to the interface 141 in contact with the window layer 130.

In some embodiments, the concentration of the first additive in the first region 140 is in a range from about $10^{16}$ cm$^{-3}$ to about $10^{20}$ cm$^{-3}$. In some embodiments, the concentration of the first additive in the first region 140 is in a range from about $10^{17}$ cm$^{-3}$ to about $10^{19}$ cm$^{-3}$. In particular embodiments, the concentration of the first additive in the first region 140 is in a range from about $10^{18}$ cm$^{-3}$ to about $10^{20}$ cm$^{-3}$.

In some embodiments, the concentration of the first additive in the second region 150 is in a range from about $10^{14}$ cm$^{-3}$ to about $10^{19}$ cm$^{-3}$. In some embodiments, the concentration of the first additive in the second region 150 is in a range from about $10^{14}$ cm$^{-3}$ to about $10^{18}$ cm$^{-3}$. In particular embodiments, the concentration of the first additive in the second region 150 is in a range from about $10^{14}$ cm$^{-3}$ to about $10^{16}$ cm$^{-3}$.

In some embodiments, the concentration of the second additive in the second region 150 is in a range from about $10^{16}$ cm$^{-3}$ to about $10^{20}$ cm$^{-3}$. In some embodiments, the concentration of the second additive in the second region 150 is in a range from about $10^{17}$ cm$^{-3}$ to about $10^{19}$ cm$^{-3}$. In some embodiments, the concentration of the second additive in the second region 150 is in a range from about $10^{18}$ cm$^{-3}$ to about $10^{22}$ cm$^{-3}$. In particular embodiments, the concentration of the second additive in the second region 150 is in a range from about $10^{18}$ cm$^{-3}$ to about $10^{20}$ cm$^{-3}$.

In some embodiments, the concentration of the second additive in the first region 140 is in a range from about $10^{14}$ cm$^{-3}$ to about $10^{19}$ cm$^{-3}$. In some embodiments, the concentration of the second additive in the first region 140 is in a range from about $10^{14}$ cm$^{-3}$ to about $10^{18}$ cm$^{-3}$. In particular embodiments, the concentration of the second additive in the first region 140 is in a range from about $10^{14}$ cm$^{-3}$ to about $10^{16}$ cm$^{-3}$.

In some embodiments, as noted earlier, the absorber layer includes two regions having different effective carrier density values. In some embodiments, the first region 140 has an effective carrier density in a range lower than about $1\times10^{14}$ cm$^{-3}$. In some embodiments, the first region 140 has an effective carrier density in a range lower than about $5\times10^{13}$ cm$^{-3}$. In some embodiments, the second region 150 has an effective carrier density in a range greater than about $1\times10^{14}$ cm$^{-3}$. In some embodiments, the second region 150 has an effective carrier density in a range greater than about $3\times10^{14}$ cm$^{-3}$. Without being bound by any theory, it is believed that a higher concentration of the second additive in the second region 150 compared to the first region 140, results in higher effective carrier density in the second region 150.

In some embodiments, as indicated in FIGS. 1-3, the window layer is further disposed on a transparent layer 120 and the transparent layer 120 is disposed on a support 110. In one embodiment, the transparent layer 120 includes an electrically conductive layer (sometimes referred to in the art as a front contact layer) 122 disposed on the support 110, as indicated in FIG. 2. In some embodiments, the window layer 130 is disposed directly on the electrically conductive layer 122. In an alternate embodiment, the transparent layer 120 includes an electrically conductive layer 122 disposed on the support 110 and an additional buffer layer 124 is interposed between the electrically conductive layer 122 and the window layer 130, as indicated in FIG. 2. In one embodiment, the transparent layer 120 has a thickness in a range from about 100 nanometers to about 600 nanometers.

In one embodiment, the electrically conductive layer 122 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the electrically conductive layer 122 may be in a range of from about 50 nm to about 600 nm, in one embodiment.

In some embodiments, the photovoltaic device 100 further includes a buffer layer (optional), also called a higher resistance transparent (HRT) layer 124, interposed between the window layer 130 and the electrically conductive layer 122, as indicated in FIG. 2. In one embodiment, the thickness of the buffer layer 124 is in a range from about 50 nm to about 200 nm Non-limiting examples of suitable materials for the buffer layer 124 include tin dioxide ($SnO_2$), zinc tin oxide (ZTO), zinc-doped tin oxide ($SnO_2$:Zn), zinc oxide (ZnO), indium oxide ($In_2O_3$), or combinations thereof.

As indicated in FIGS. 1-3, the transparent layer 120 is further disposed on a support 110. As illustrated in FIG. 3, in such embodiments, the solar radiation 10 enters from the support 110, and after passing through the transparent layer 120 and the window layer 130, enters the absorber layer 160, where the conversion of electromagnetic energy of incident light (for instance, sunlight) to electron-hole pairs (that is, to free electrical charge) occurs.

In one embodiment, the support 110 is transparent over the range of wavelengths for which transmission through the support 110 is desired. In one embodiment, the support 110 may be transparent to visible light having a wavelength in a range from about 400 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent layer 120 and the support 110, such as, for example, an anti-reflective layer or a barrier layer (not shown).

In one embodiment, the photovoltaic device 100 further includes a p+-type semiconductor layer 170 disposed on the absorber layer 160, as indicated in FIG. 3. The term "p+-type semiconductor layer" as used herein refers to a semiconductor layer having an excess mobile p-type carrier or hole density compared to the p-type charge carrier or hole density in the absorber layer 160. In some embodiments, the p+-type semiconductor layer has a p-type carrier density in a range greater than about $1\times10^{16}$ per cubic centimeter. In some embodiments, the p+-type semiconductor layer has a p-type carrier density in a range greater than about $5\times10^{17}$ per cubic centimeter. In some embodiments, the p+-type semiconductor layer has a p-type carrier density in a range greater than about $1\times10^{18}$ per cubic centimeter. In particular embodiments, the p+-type semiconductor layer has a p-type carrier density in a range from about $1\times10^{17}$ per cubic centimeter to about $1\times10^{20}$ per cubic centimeter.

The p+-type semiconductor layer 170 may be used as an interface between the absorber layer 160 and the back contact layer 180, in some embodiments. Higher carrier densities of the p+-type semiconductor layer 170 may minimize the series resistance of the back contact layer, in comparison to other resistances within the device. In one embodiment, the p+-type semiconductor layer 170 has a thickness in a range from about 50 nm to about 200 nm.

In one embodiment, the p+-type semiconductor layer 170 includes a heavily doped p-type material selected from the group consisting of amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, $LaCuOSe_{0.6}Te_{0.4}$, BiCuOSe, BiCaCuOSe, PrCuOSe, NdCuOS, $Sr_2Cu_2ZnO_2S_2$, $Sr_2CuGaO_3S$, $(Zn,Co,Ni)O_x$, and combinations thereof.

In another embodiment, the p+-type semiconductor layer 170 includes a heavily doped p+-doped material selected from the group consisting of zinc telluride, magnesium telluride, manganese telluride, beryllium telluride, mercury telluride, arsenic telluride, antimony telluride, copper telluride, and combinations thereof. In some embodiments, the p+-doped material further includes a dopant selected from the group consisting of copper, gold, nitrogen, phosphorus, antimony, arsenic, silver, bismuth, sulfur, sodium, and combinations thereof.

In one embodiment, the photovoltaic device 100 further includes a metal layer, also called a back contact layer 180, as indicated in FIG. 3. In some embodiments, the metal layer 180 is disposed directly on the absorber layer 160 (not shown). In some other embodiments, the metal layer 180 is disposed on the p+-type semiconductor layer 170 disposed on the absorber layer 160, as indicated in FIG. 3. In some embodiments, the p+-type semiconductor layer 170 may provide for improved diffusion properties between the metal layer 180 and the absorber layer 160. Accordingly, in some embodiments, any suitable metal having the desired conductivity and reflectivity may be selected as the back contact layer 180. In one embodiment, the metal layer 180 includes gold, platinum, molybdenum, tungsten, tantalum, palladium, aluminum, chromium, nickel, or silver. In certain embodiments, another metal layer (not shown), for example, aluminum, may be disposed on the metal layer 180 to provide lateral conduction to the outside circuit.

As noted earlier, in one embodiment, a photovoltaic device 100 having a graded absorber layer 160 is provided. Referring to FIGS. 1-4, in one embodiment, the photovoltaic device 100 includes a window layer 130 and an absorber layer 160 disposed on the window layer 130, wherein the absorber layer 160 includes a first region 140 and a second region 150, the first region 140 disposed adjacent to the window layer 130. The absorber layer 160 further includes a first additive and a second additive, the first additive including oxygen and the second additive including nitrogen, zinc, arsenic, phosphorous, antimony, or combinations thereof, in one embodiment. A concentration of the first additive continuously decreases from the first region 140 to the second region 150, and a concentration of the se7cond additive continuously increases from the first region 140 to the second region 150, in one embodiment.

In an alternate embodiment, a photovoltaic device having an absorber layer having two distinct compositional regimes is provided. Referring to FIGS. 1-4, in one embodiment, the photovoltaic device 100 includes a window layer 130 and an absorber layer 160 disposed on the window layer 130, wherein the absorber layer 160 includes a first region 140 and a second region 150, the first region 140 disposed adjacent to the window layer 130. The absorber layer 160 further includes a first additive and a second additive, the first additive including oxygen and the second additive including nitrogen, zinc, arsenic, phosphorous, antimony, or combinations thereof, in one embodiment. Further, the first region 140 includes the first additive and is substantially free of the second additive, and the second region 150 includes the second additive and is substantially free of the first additive, in one embodiment.

In one embodiment, a method of making a photovoltaic device is provided. Referring to FIGS. 1-3, in some embodiments, the method includes disposing a transparent layer 120 including an electrically conductive layer 122 on a support 110 by any suitable technique, such as sputtering, chemical vapor deposition, spin coating, spray coating, or dip coating. Referring to FIG. 3, in some embodiments, an optional buffer layer 124 may be deposited on the electrically conductive layer 122 using sputtering to form the transparent layer 120. The n-type semiconductor layer or window layer 130 may be then deposited on the transparent layer 120. Non-limiting examples of the deposition methods for the n-type semiconductor layer 130 include one or more of close-space sublimation (CSS), vapor transport method (VTM), sputtering, and electrochemical bath deposition (CBD).

In some embodiments, the method further includes disposing an absorber layer 160 on the window layer 130. In one embodiment, the absorber layer 160 may be deposited by employing one or more methods selected from close-space sublimation (CSS), vapor transport method (VTM), ion-assisted physical vapor deposition (IAPVD), radio frequency or pulsed magnetron sputtering (RFS or PMS), plasma enhanced chemical vapor deposition (PECVD), and electrochemical deposition (ECD).

In some embodiments, the method includes disposing the absorber layer 160 in a step-wise manner, wherein disposing the absorber layer includes disposing the first region 140 on the window layer 130 in a first environment including a precursor for a first additive, and disposing a second region 150 on the first region 140 in a second environment including a precursor for a second additive.

In some embodiments, the method of disposing the absorber layer 160 is a continuous process where a first region 140 is disposed in an environment including the first additive and the second region is disposed in an environment including the second additive. In some embodiments, the method of disposing the absorber layer 160 includes disposing the first region 140 on the window layer 130 in the presence of a continuous flow of the first additive. In some embodiments, the second region 150 is disposed on the first region 140 by turning off the flow of the first additive and turning on the flow of the second additive.

In one embodiment, the first environment includes a source for the first additive and a source for the second additive, wherein a concentration of the first additive is greater than a concentration of the second additive in the first environment. In some embodiments, the first additive includes oxygen and the second additive includes nitrogen, and the first environment is substantially oxygen-rich.

In an alternate embodiment, the first environment is substantially free of the second additive. In such embodiments, the first environment includes a first additive or a source for first additive. In one particular embodiment, the first environment includes oxygen or an oxygen source.

In one embodiment, the second environment includes a source for the first additive and a source for the second additive, wherein a concentration of the second additive is greater than a concentration of the first additive in the second environment. In some embodiments, the first additive includes oxygen and the second additive includes nitrogen, and the second environment is substantially nitrogen-rich.

In an alternate embodiment, the second environment is substantially free of the first additive. In such embodiments, the second environment includes a second additive or a source for the second additive. In one particular embodiment, the second environment includes nitrogen or a nitrogen source.

Without being bound by any theory, it is believed that two separate growth regimes for the first region 140 and the second region 150 allow for an oxygen-rich CdS/CdTe interface and further reduces gas-phase interactions that may occur between the second additive and oxygen at the CdS/CdTe interface.

In some embodiments, the method includes disposing a first region 140 on the window layer 130 in a graded manner, such that the concentration of the first additive is compositionally graded across the thickness of the first region 140. In some embodiments, the method includes disposing an absorber layer 160 on the window layer 130 in graded manner, such that the concentration of the first additive is graded across the thickness of the absorber layer 160.

In some embodiments, the method includes disposing a second region 150 on the first region 140 in graded manner, such that the concentration of the second additive is compositionally graded across the thickness of the second region 150. In some embodiments, the method includes disposing an absorber layer 160 on the window layer 130 in graded manner, such that the concentration of the second additive is graded across the thickness of the absorber layer 160.

In one embodiment, after the step of disposing the second region 150 to form the absorber layer 160, the absorber layer 160 may be further treated with cadmium chloride ($CdCl_2$). In one embodiment, the absorber layer 160 may be treated with a solution of $CdCl_2$. In another embodiment, the absorber layer 160 may be treated with $CdCl_2$ vapor. The treatment with $CdCl_2$ is known to increase the carrier lifetime of the absorber layer 160. The treatment with cadmium chloride may be followed by an etching or rinsing step. In one embodiment, etching may be carried out using a suitable acid. In other embodiments, the $CdCl_2$ may be rinsed off the surface, resulting in a stoichiometric cadmium telluride at the interface, mainly removing the cadmium oxide and $CdCl_2$ residue from the surface, leaving a cadmium-to-tellurium ratio of about 1 at the surface. The etching works by removing non-stoichiometric material that forms at the surface during processing. Other etching techniques known in the art that may result in a stoichiometric cadmium telluride at the back interface may also be employed.

Referring to FIG. 3, a p+-type semiconducting layer 170 may be further disposed on the absorber layer 160 by depositing a p+-type material using any suitable technique, for example PECVD, in one embodiment. In an alternate embodiment, a p+-type semiconductor layer 170 may be disposed on the absorber layer 160 by chemically treating the absorber layer 160 to increase the carrier density on the back-side (side in contact with the metal layer and opposite to the window layer) of the absorber layer 160. In one embodiment, the photovoltaic device 100 may be completed by depositing a back contact layer, for example, a metal layer 180 on the p+-type semiconductor layer 170.

EXAMPLES

Example 1

Preparation of the Cadmium Telluride Photovoltaic Device Having a CdTe Layer Deposited Using a Gradient of Oxygen A cadmium telluride photovoltaic device was prepared by depositing a cadmium telluride (CdTe) layer over a cadmium sulfide (CdS) layer deposited on $SnO_2$:F (FTO) transparent conductive oxide (TCO) coated substrate. The substrate was 3 millimeters thick soda-lime glass, coated with a FTO transparent conductive layer (450 nm) and a thin high resistance transparent $ZnSnO_x$ (ZTO) layer (100 nm). Cadmium sulfide (CdS) layer was deposited on the ZTO layer in the presence of oxygen (CdS:O (5% O)) at a thickness of about 80 nm.

The CdTe layer was deposited using a close spaced sublimation process at a substrate temperature of about 550 degrees Celsius and a source temperature of about 625 degrees Celsius. During ramping of the substrate and source temperatures, the substrate temperature ramp rate was greater than the source temperature ramp rate. CdTe deposition began when the substrate temperature reached its set point and the source temperature exceeded the substrate temperature. Two samples using different deposition conditions for oxygen were prepared-samples 1 and 2.

For preparation of Sample 1, oxygen was allowed to flow for 100 seconds at the beginning of the deposition step. This step resulted in the deposition of oxygen-containing first region on the absorber layer. After 100 seconds the oxygen was turned off and the remainder of the CdTe layer was deposited without oxygen while maintaining the same background pressure. 100 seconds was approximately the length of time required for the source temperature to reach its set point of 625 degrees Celsius. This step resulted in the deposition of second region on the absorber layer. As noted earlier, during the second step a second additive, for example, nitrogen may be turned on to form the second region on the first region.

For preparation of Sample 2, oxygen was allowed to flow for 130 seconds at the beginning of CdTe deposition step. This step resulted in the deposition of oxygen-containing first region on the absorber layer. After 130 seconds the oxygen was turned off and the remainder of the CdTe layer was deposited without oxygen while maintaining the same background pressure. In this sample, the oxygen flow was continued for an additional 30 sec after the source temperature reached its set point. This step resulted in the deposition of second region on the absorber layer. As noted earlier, during the second step a second additive, for example, nitrogen may be turned on to form the second region on the first region.

The deposited cadmium telluride layer was further treated with cadmium chloride at a temperature of 400 degrees Celsius for about 20 minutes in air. At the end of the stipulated time, the CdTe layer was treated with a copper solution and subjected to annealing at a temperature of 200 degrees Celsius for a duration of 18 minutes. Gold was then deposited on the copper treated layer as the back contact by evaporation process to complete the device fabrication process.

Comparative Example 1

Preparation of the Cadmium Telluride Photovoltaic Device Having a CdTe Layer Deposited with Continuous Oxygen Flow A photovoltaic device was prepared similar to the photovoltaic devices in Samples 1 and 2 except the CdTe layer was deposited with oxygen flowing continuously throughout the CdTe growth process.

Comparative Example 2

Preparation of the Cadmium Telluride Photovoltaic Device Having a CdTe Layer Deposited in the Absence of Oxygen Flow A photovoltaic device was prepared similar to the photovoltaic device in Samples 1 and 2 except the CdTe layer was deposited without oxygen flowing through the growth process.

Table 1 shows the average (Avg) efficiency, open-circuit voltage ($V_{OC}$), short-circuit current density ($J_{Sc}$), and fill factor (FF) values for Samples 1 and 2 compared to Comparative Samples 1 and 2 and standard deviation (StDev) associated with these values.

TABLE 1

Performance parameters for CdTe photovoltaic devices

| Sample | Efficiency (%) | | $V_{OC}$ (mV) | | $J_{SC}$ (mA/cm$^2$) | | FF (%) | |
|---|---|---|---|---|---|---|---|---|
| | Avg | StDev | Avg | StDev | Avg | StDev | Avg | StDev |
| Sample 1 | 13.5 | 0.3 | 828 | 2 | 21.5 | 0.4 | 76.0 | 0.6 |
| Sample 2 | 13.9 | 0.2 | 827 | 2 | 22.1 | 0.4 | 75.8 | 0.4 |
| Comparative Example 1 | 13.2 | 0.3 | 815 | 4 | 22.4 | 0.3 | 72.4 | 1.0 |
| Comparative Example 2 | 12.9 | 0.3 | 804 | 6 | 21.5 | 0.4 | 74.5 | 3.9 |

It may be noted from Table 1 that the devices with the CdTe layer deposited using oxygen gradient displayed an increase in the FF and Voc when compared with the performance parameters of devices having CdTe layer deposited using continuous oxygen flow. Further, devices with the CdTe layer deposited using oxygen gradient displayed an increase in the FF and Voc when compared with the performance parameters of devices having CdTe layer deposited in the absence of oxygen flow. The devices in Samples 1 and 2 displayed higher $V_{OC}$ and FF, contributing to a higher efficiency.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
a window layer comprising a first semiconductor material doped to be n-type; and
an absorber layer comprising a second semiconductor material doped to be p-type, the first and second semiconductor materials being different, the absorber layer disposed on the window layer, wherein the absorber layer comprises a first region and a second region, each having the second semiconductor material doped to be p-type, the first region being an interfacial region disposed adjacent to the window layer and the second region being a bulk region, the first region having a first thickness, the second region having a second thickness, wherein the first thickness is less than the second thickness;
wherein the absorber layer comprises a first additive and a second additive,
wherein the first additive comprises oxygen compositionally graded across a thickness of the absorber layer,
wherein a concentration of the first additive in the first region is greater than a concentration of the first additive in the second region, and the first additive provides for an improved interface between the window layer and the absorber layer, and
wherein a concentration of the second additive in the second region is greater than a concentration of the second additive in the first region.

2. The photovoltaic device of claim 1, wherein the second additive comprises nitrogen, arsenic, phosphorous, antimony, zinc, or combinations thereof.

3. The photovoltaic device of claim 1, wherein the second additive comprises nitrogen.

4. The photovoltaic device of claim 1, wherein the second additive comprises zinc.

5. The photovoltaic device of claim 1, wherein the second additive comprises nitrogen and zinc.

6. The photovoltaic device of claim 1, wherein the second additive is compositionally graded across a thickness of the absorber layer.

7. The photovoltaic device of claim 1, wherein the concentration of the first additive in the first region is in a range from about $10^{16}$ cm$^{-3}$ to about $10^{20}$ cm$^{-3}$.

8. The photovoltaic device of claim 1, wherein the concentration of the first additive in the second region is in a range from about $10^{14}$ cm$^{-3}$ to about $10^{19}$ cm$^{-3}$.

9. The photovoltaic device of claim 1, wherein the concentration of the second additive in the second region is in a range from about $10^{16}$ cm$^{-3}$ to about $10^{20}$ cm$^{-3}$.

10. The photovoltaic device of claim 1, wherein the concentration of the second additive in the second region is in a range from $10^{18}$ cm$^{-3}$ to about $10^{22}$ cm$^{-3}$.

11. The photovoltaic device of claim 1, wherein the concentration of the second additive in the first region is in a range from about $10^{14}$ cm$^{-3}$ to about $10^{19}$ cm$^{-3}$.

12. The photovoltaic device of claim 1, wherein the first thickness is in a range from about 10 nanometers to about 500 nanometers.

13. The photovoltaic device of claim 1, wherein the second thickness is in a range from about 1000 nanometers to about 5000 nanometers.

14. The photovoltaic device of claim 1, wherein the absorber layer comprises cadmium telluride, cadmium zinc telluride, cadmium sulfur telluride, cadmium manganese telluride, cadmium magnesium telluride, or combinations thereof.

15. The photovoltaic device of claim 1, wherein the window layer comprises cadmium sulfide, cadmium selenide, oxygenated cadmium sulfide, zinc telluride, zinc selenide, zinc sulfide, indium selenide, indium sulfide, zinc oxihydrate, or combinations thereof.

16. The photovoltaic device of claim 1, wherein the first region has an effective carrier density in a range lower than about $1 \times 10^{14}$ cm$^{-3}$.

17. The photovoltaic device of claim 1, wherein the second region has an effective carrier density in a range greater than about $3 \times 10^{14}$ cm$^{-3}$.

18. A photovoltaic device, comprising:
a window layer comprising a first semiconductor material doped to be n-type; and
an absorber layer comprising a second semiconductor material doped to be p-type, the first and second semiconductor materials being different, the absorber layer disposed on the window layer, wherein the absorber layer comprises a first region and a second region, each having the second semiconductor material doped to be p-type, the first region being an interfacial region disposed adjacent to the window layer and the second region being a bulk region, the interfacial region having a thickness less than that of the bulk region;
wherein the absorber layer comprises a first additive and a second additive,
the first additive comprising oxygen and the second additive comprising nitrogen, zinc, arsenic, phosphorous, antimony, or combinations thereof,
wherein a concentration of the first additive continuously decreases across a thickness of the absorber layer from the first region to the second region, and
wherein a concentration of the second additive continuously increases across the thickness of the absorber layer from the first region to the second region.

19. The photovoltaic device of claim 18, wherein the first region of the absorber layer has a first effective carrier density in a range of about $1 \times 10^{13}$ to about $1 \times 10^{14}$ per cubic centimeter, and the second region of the absorber layer has a second effective carrier density in a range of about $1\times10^{14}$ to about $1\times10^{16}$ per cubic centimeter.

* * * * *